(12) United States Patent
Chang et al.

(10) Patent No.: US 9,441,888 B2
(45) Date of Patent: *Sep. 13, 2016

(54) LOOP TYPE PRESSURE-GRADIENT-DRIVEN LOW-PRESSURE THERMOSIPHON DEVICE

(75) Inventors: Shyy-Woei Chang, Sinjhuang (TW); Kuei-Feng Chiang, Sinjhuang (TW)

(73) Assignee: Asia Vital Components Co., Ltd., Sinjhuang (TW)

( * ) Notice: Subject to any disclaimer, the term of this patent is extended or adjusted under 35 U.S.C. 154(b) by 755 days.

This patent is subject to a terminal disclaimer.

(21) Appl. No.: 12/968,279

(22) Filed: Dec. 15, 2010

(65) Prior Publication Data

US 2012/0024499 A1 Feb. 2, 2012

(30) Foreign Application Priority Data

Jul. 30, 2010 (TW) ................................ 99125256 A

(51) Int. Cl.
| | |
|---|---|
| *F28D 15/00* | (2006.01) |
| *F28D 15/02* | (2006.01) |
| *H05K 7/20* | (2006.01) |
| *H01L 23/427* | (2006.01) |
| *F28F 13/06* | (2006.01) |

(52) U.S. Cl.
CPC ........... *F28D 15/0266* (2013.01); *F28F 13/06* (2013.01); *H01L 23/427* (2013.01); *H05K 7/20309* (2013.01); *H05K 7/20336* (2013.01)

(58) Field of Classification Search
CPC ...................... H05K 7/20309; H05K 7/20336; H01L 23/427; F28D 15/0266; F28D 15/046
USPC ............ 165/104.21, 104.28, 104.19, 104.22, 165/104.26, 104.33
See application file for complete search history.

(56) References Cited

U.S. PATENT DOCUMENTS

| | | | | |
|---|---|---|---|---|
| 6,698,502 | B1 * | 3/2004 | Lee ........................ | 165/104.26 |
| 8,363,402 | B2 * | 1/2013 | Brunschwiler et al. ...... | 361/699 |
| 9,074,823 | B2 * | 7/2015 | Chang ................ | F28D 15/0233 |
| 2002/0195230 | A1 * | 12/2002 | Li ............................ | 165/104.33 |
| 2003/0079865 | A1 | 5/2003 | Son et al. | |
| 2004/0250994 | A1 * | 12/2004 | Chordia ............. | F28D 15/0266 165/80.4 |

(Continued)

FOREIGN PATENT DOCUMENTS

| | | |
|---|---|---|
| CN | 1786647 A | 6/2006 |
| CN | 201059899 Y | 5/2008 |

(Continued)

*Primary Examiner* — M. Alexandra Elve
*Assistant Examiner* — Eric Ruppert
(74) *Attorney, Agent, or Firm* — C. G. Mersereau; Nikolai & Mersereau, P.A.

(57) ABSTRACT

A loop type pressure-gradient-driven low-pressure thermosiphon device includes a case sealed by a cover to define a chamber with a vaporizing section. The vaporizing section includes a plurality of spaced flow-guiding members and first flow passages formed between adjacent flow-guiding members. The flow passages respectively have at least one free end communicating with a free zone in the chamber. A pipeline is connected at two ends to two opposite sides of the case, and has a second flow passage communicable with the vaporizing section. The pipeline extends through at least one heat-dissipating element, so that the pipeline and the heat-dissipating element together define a condensing section. In the thermosiphon device, a low-pressure end is created through proper pressure-reduction design to form a pressure gradient for driving steam-water circulation, and the working fluid can be driven to circulate and transfer heat in the pipeline and the case without any wick structure.

10 Claims, 7 Drawing Sheets

(56) References Cited

U.S. PATENT DOCUMENTS

| | | | |
|---|---|---|---|
| 2008/0259566 A1* | 10/2008 | Fried | 361/699 |
| 2009/0114372 A1* | 5/2009 | Ippoushi et al. | 165/104.19 |
| 2009/0205808 A1* | 8/2009 | Wan et al. | 165/80.4 |
| 2010/0018676 A1* | 1/2010 | Yang et al. | 165/104.19 |
| 2010/0172091 A1* | 7/2010 | Nishiura | 361/689 |
| 2012/0018131 A1* | 1/2012 | Chang | F28D 15/0266 165/104.21 |
| 2012/0018137 A1* | 1/2012 | Chang et al. | 165/185 |
| 2012/0227936 A1* | 9/2012 | Yang | 165/104.26 |

FOREIGN PATENT DOCUMENTS

| | | |
|---|---|---|
| CN | 101307996 A | 11/2008 |
| TW | 504822 B | 10/2002 |
| TW | M329808 U | 4/2008 |
| TW | M366664 U | 10/2009 |

* cited by examiner

LOOP TYPE PRESSURE-GRADIENT-DRIVEN LOW-PRESSURE THERMOSIPHON DEVICE

This application claims the priority benefit of Taiwan patent application number 099125256 filed on Jul. 30, 2010.

FIELD OF THE INVENTION

The present invention relates to a loop type pressure-gradient-driven low-pressure thermosiphon device, and more particularly to a loop type pressure-gradient-driven low-pressure thermosiphon device that enables enhanced steam-water circulation without the need of using any wick structure and has reduced thermal resistance.

BACKGROUND OF THE INVENTION

In recent years, with the prosperous development in the electronic semiconductor industry, the progress in the process technique and the trends in the market demands, all kinds of electronic devices have been designed to be compact, low-profile and light in weight. However, while the electronic devices have gradually reduced dimensions, they have increasing functions and computing ability. For example, home or business computers, communication chassis, and home or industrial heat exchanger all include many electronic elements that would produce heat during the operation thereof. Among others, electronic chips or elements for executing computation produce the largest part of heat in the computer. Under this circumstance, a heat sink formed from radiating fins and cooling fans for dissipating heat plays an important role in protecting these electronic elements against overheating, so that these electronic elements can maintain at a normal working temperature to fully extend the intended functions thereof.

While the water cooling technique has already been widely applied in personal computers, it is not positively employed in heat exchangers for communication, home or industrial purpose. In the water cooling technique, the large-volume radiating fins are omitted, and heat from heat sources in the electronic system is collected and transferred to the working fluid. Then, the heat-absorbed working fluid exchanges heat with air via a heat exchanger. Since the length of the pipeline for water cooling can be changed according to actual need, the heat exchanger (i.e. the radiating fins) can be flexibly disposed at different positions and can be advantageously designed without spatial restriction. However, a water cooling system requires a pump to drive the working fluid to flow in the pipeline, and a water tank to store sufficient water as the working fluid. That is, the water cooling system is subject to the reliability of the pump, possible leakage in the pipeline, and the like. However, due to the increasing heat produced by the heat-producing elements in the personal computer, the water-cooling heat dissipating technique, though not so perfect for use, is still the best choice in the current market for heat management and control. While the water cooling technique can be well applied to the personal computer that has a relatively large volume and is not subject to any spatial restriction, the water cooling technique for heat dissipation seems useless at all in terms of the communication chassis and home or industrial heat exchangers that are usually compact, low-profile and small in volume. Therefore, for the present, heat pipes or small-size heat sinks are still used in the communication chassis and home or industrial heat exchangers for heat transfer, and radiating fins are further used to exchange heat with ambient air. In view of these problems, the information industry and other related electronic industries all have positively tried to find other heat dissipation techniques capable of providing higher heat flux, so as to meet the growing demands for heat dissipation.

In the conventional heat dissipation techniques, heat pipe and uniform temperature plate are also used as heat transfer elements. In manufacturing the heat pipe and the uniform temperature plate, a sintered layer is formed on the inner wall surface thereof to serve as a wick structure. To form the sintered layer, first fill copper particles or powder in the inner wall of the heat pipe and the uniform temperature plate, and then tightly press the metal (i.e. copper) particles or powder before sintering the metal particles or powder in a sinter furnace to form a porous wick structure. While the sintered layer provides a capillary force, it also increases an overall thickness of the heat pipe and the uniform temperature plate, preventing the latter from being effectively slimmed. As to the currently known vapor chamber (VC), it uses a sintered core, grids, or grooves to produce the capillary force for driving steam-water circulation in the heat pipe or the vapor chamber. However, the above structure is not ideal for use because it involves in a very complicated manufacturing process and accordingly, increased manufacturing cost.

It is also possible to use the conventional loop type thermosiphon device as a heat transfer element. Since the conventional loop type thermosiphon device mainly employs capillary force and gravity force to drive steam-water circulation, it is subject to the limitation by gravity force. Further, the loop type thermosiphon device has a relatively higher thermal resistance, and can only have a restricted rolling angle. That is, there is a lot of limitation in the design and application of the conventional loop type thermosiphon device.

Therefore, the currently commercially available all-in-one personal computers or remote radio units (RRU) all adopt the so-called heatpipe cooler solution. However, the heat pipe has limitation in its heat load, and accordingly, multiple pieces of heat pipes are frequently required to inevitably increase the cost of the personal computer and the RRU. Meanwhile, the heat pipe may not necessarily have a thermal resistance that always satisfies the thermal resistance requirement for a central processing unit (CPU).

Moreover, the selection of a vapor core is not easy. It is very important to select a proper vapor core, which must be able to keep the condensate at a desired flowing speed and must be able to maintain sufficient capillary pressure to overcome any undesired influence from the force of gravity on the vapor and the condensate.

In brief, the prior art heat pipe or vapor chamber has the following disadvantages: (1) uneasy to fabricate; (2) unable to be slimmed; (3) high manufacturing cost; and (4) consuming time and labor to manufacture.

SUMMARY OF THE INVENTION

A primary object of the present invention is to provide a loop type pressure-gradient-driven low-pressure thermosiphon device that enables enhanced steam-water circulation in a loop type heat pipe and has reduced thermal resistance.

Another object of the present invention is to provide a loop type pressure-gradient-driven low-pressure thermosiphon device that can be manufactured without using any sintering process to form any internal wick structure and therefore has reduced manufacturing cost.

To achieve the above and other objects, the loop type pressure-gradient-driven low-pressure thermosiphon device according to the present invention includes a case, a cover, a pipeline, and at least one heat-dissipating element. The case internally defines a chamber, in which a vaporizing section is provided. The vaporizing section includes a plurality of flow-guiding members being arrayed to space from one another, so that at least one first flow passage is formed between any two adjacent flow-guiding members. The first flow passages respectively have at least one free end communicable with a free zone in the chamber. The cover is correspondingly closed onto the case to seal the chamber. The pipeline has a second flow passage communicable with the vaporizing section, and is connected at two ends to two opposite sides of the case. The heat-dissipating element is extended through by the pipeline, so that the pipeline and the heat-dissipating element together define a condensing section.

In the loop type pressure-gradient-driven low-pressure thermosiphon device of the present invention, first flow passages are properly defined between adjacent flow-guiding members, so that overheated vapor is produced in the first flow passages, which are in contact with a heat source, to provide high pressure needed to drive steam-water circulation in the thermosiphon device. Further, with a proper pressure reduction design, a low-pressure end is form before the condensing section to produce a pressure gradient needed to drive steam-water circulation in the loop type pressure-gradient-driven low-pressure thermosiphon device. That is, with the present invention, no internal wick structure is needed to drive the working fluid in the case and the pipeline to transfer heat. In addition, the heat transfer efficiency of the present invention can be largely upgraded while the manufacturing cost thereof can be largely reduced.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
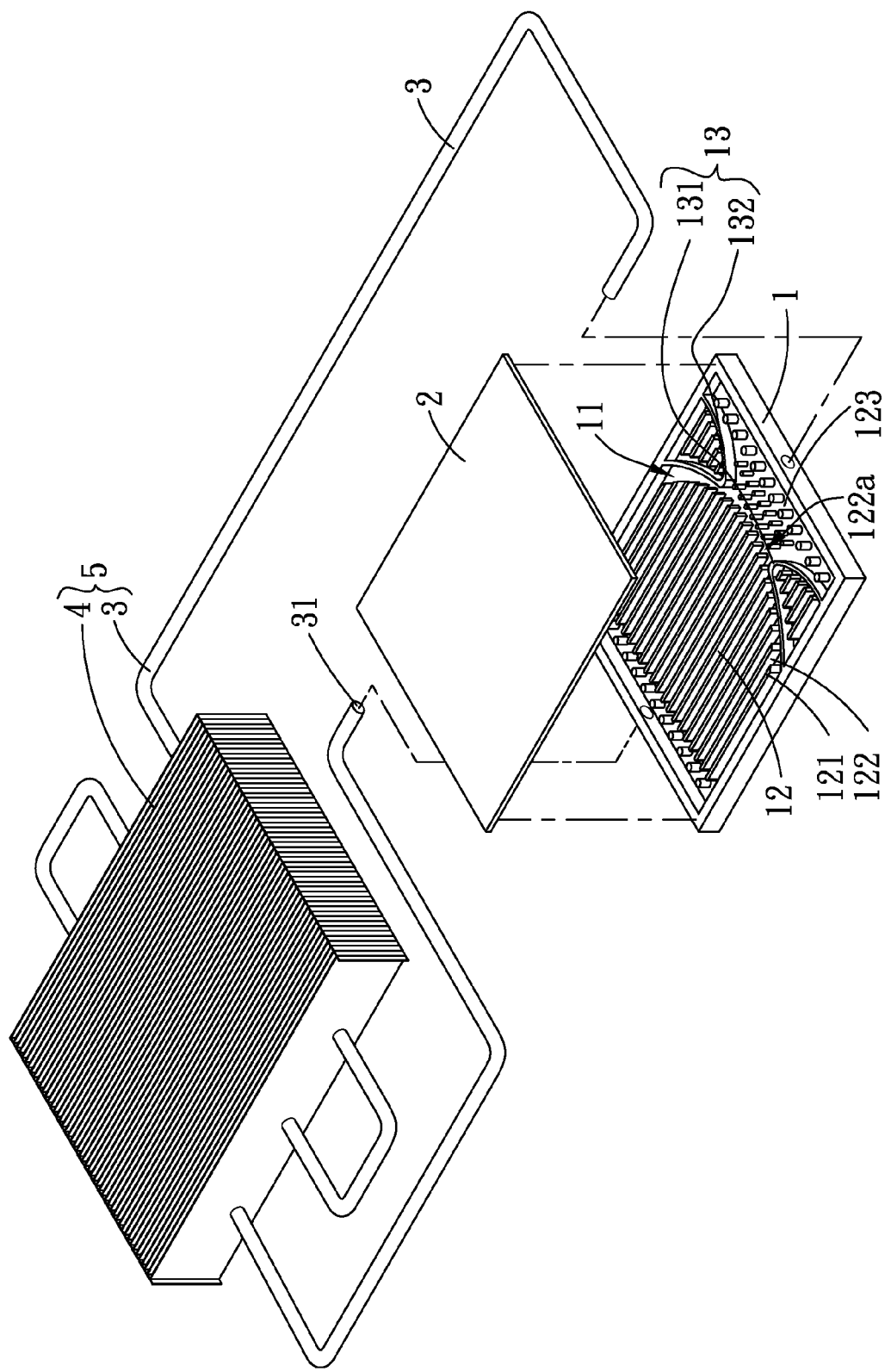
FIG. 1 is an exploded perspective view of a loop type pressure-gradient-driven low-pressure thermosiphon device according to a first embodiment of the present invention.

The present invention will now be described with some preferred embodiments thereof and with reference to the accompanying drawings. For the purpose of easy to understand, elements that are the same in the preferred embodiments are denoted by the same reference numerals.

Figure 2:
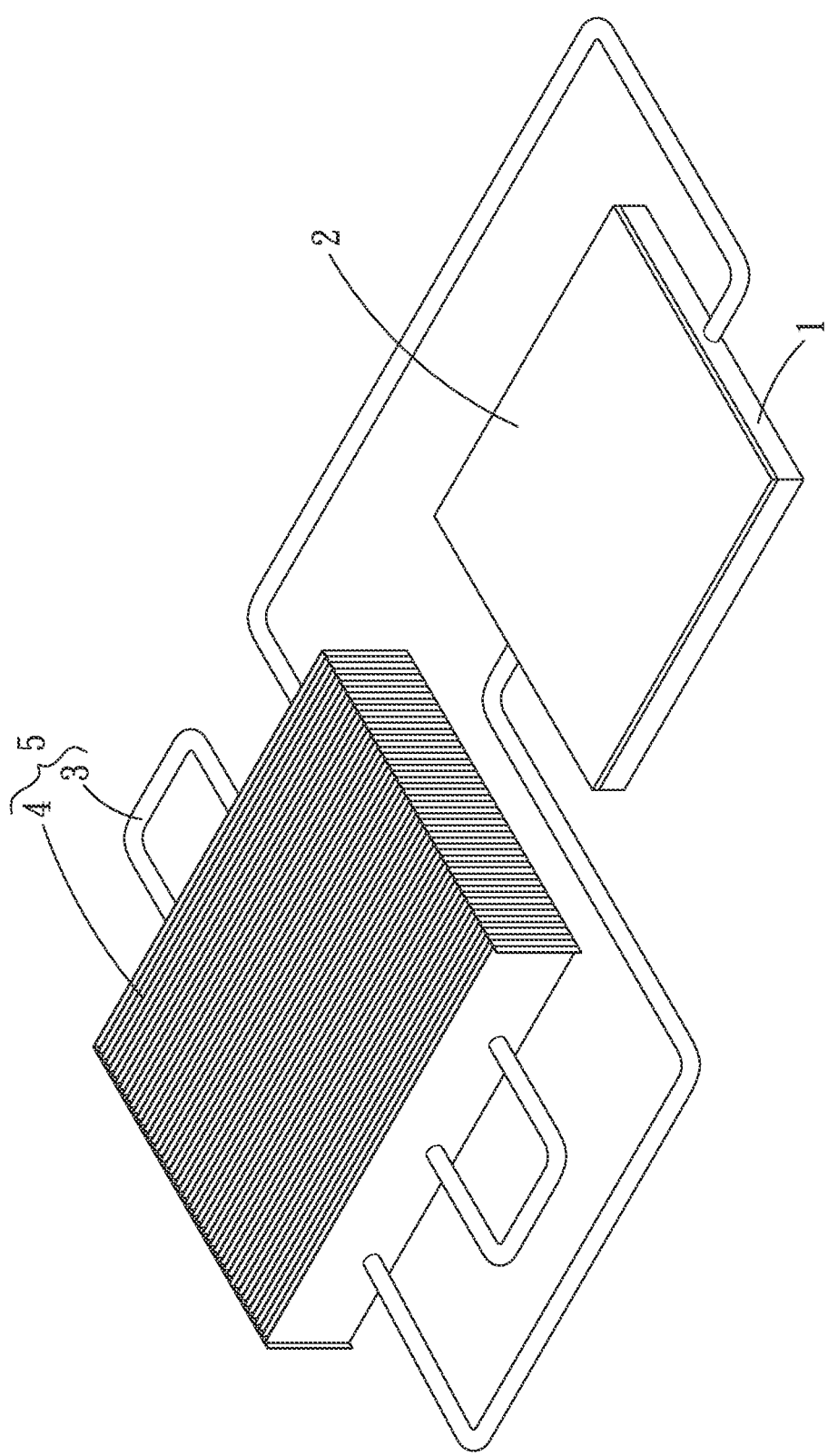
FIG. 2 is an assembled view of FIG. 1.
Figure 3:
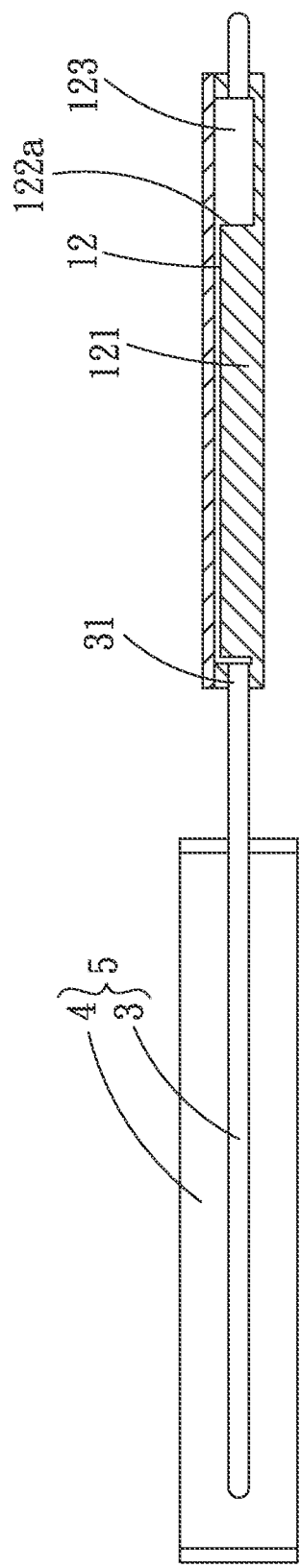
FIG. 3 is a sectioned side view of FIG. 2.

Please refer to FIGS. 1, 2 and 3. A loop type pressure-gradient-driven low-pressure thermosiphon device according to a first embodiment of the present invention includes a case 1, a cover 2, a pipeline 3, and at least one heat-dissipating element 4.

The case 1 defines a chamber 11. In the chamber 11, there is provided a vaporizing section 12 and a guiding section 13. The vaporizing section 12 includes a plurality of flow-guiding members 121 being arrayed to space from one another, such that at least one first flow passage 122 is formed between any two adjacent flow-guiding members 121. The first flow passages 122 respectively have at least one free end 122a communicating with a free zone 123 in the chamber 11. The guiding section 13 includes a first guiding portion 131 and a second guiding portion 132. The first and second portions 131, 132 are arranged between the flow-guiding members 121 of the vaporizing section 12 and the free zone 123 and extending from two opposite walls of the chamber 11 to a center.

Figure 4:
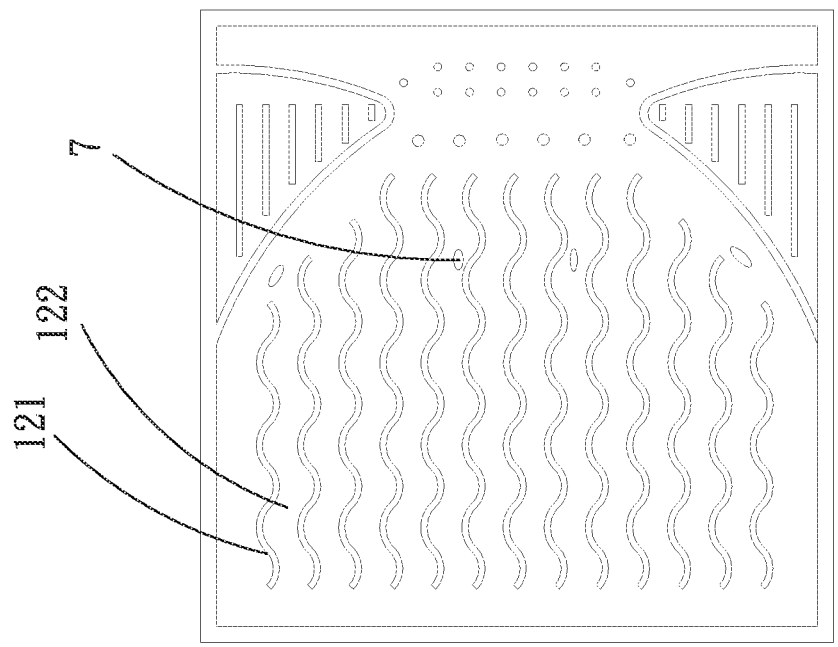
FIG. 4 is a front view showing a first variant of the vaporizing section for the loop type pressure-gradient-driven low-pressure thermosiphon device according to the first embodiment of the present invention.

In the illustrated first embodiment, the flow-guiding members 121 are respectively an elongated rib. The elongated ribs are arrayed to transversely space from one another, and the first flow passages 122 are respectively formed between adjacent elongated ribs. In a variant of the vaporizing section 12, the elongated ribs are respectively extended in a wave form, as shown in FIG. 4.

Figure 5:
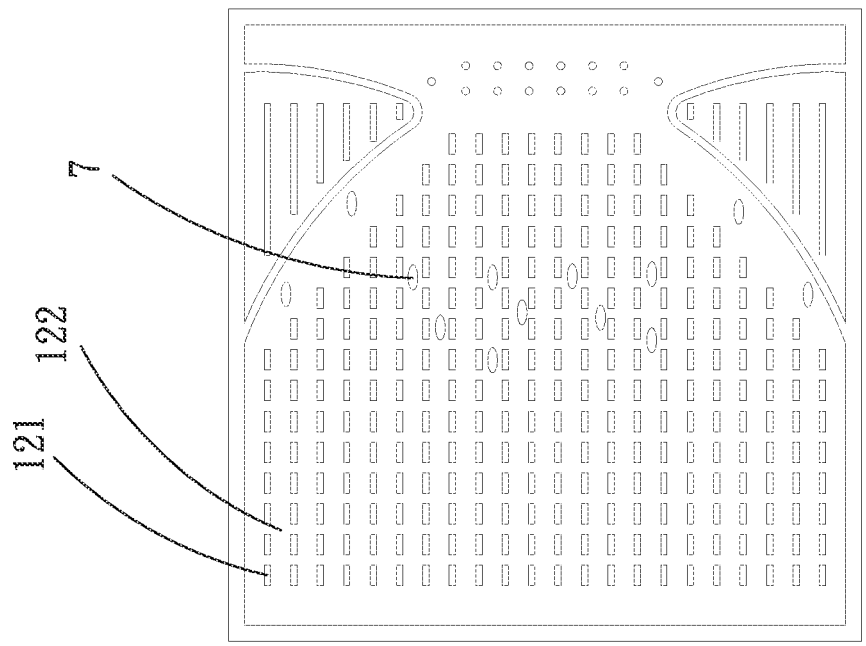
FIG. 5 is a front view showing a second variant of the vaporizing section for the loop type pressure-gradient-driven low-pressure thermosiphon device according to the first embodiment of the present invention.

It is also possible for a plurality of the flow-guiding members 121 to be longitudinally arrayed and spaced from one another, as a second variant of the vaporizing section 12 shown in FIG. 5. That is, the flow-guiding members 121 are discontinuously arrayed in a longitudinal direction.

The cover 2 is correspondingly closed onto the case 1 to seal the chamber 11.

The pipeline 3 has a second flow passage 31. The pipeline 3 is connected at two ends to two opposite sides of the case 1 with the second flow passage 31 communicable with the vaporizing section 12.

Figure 9:
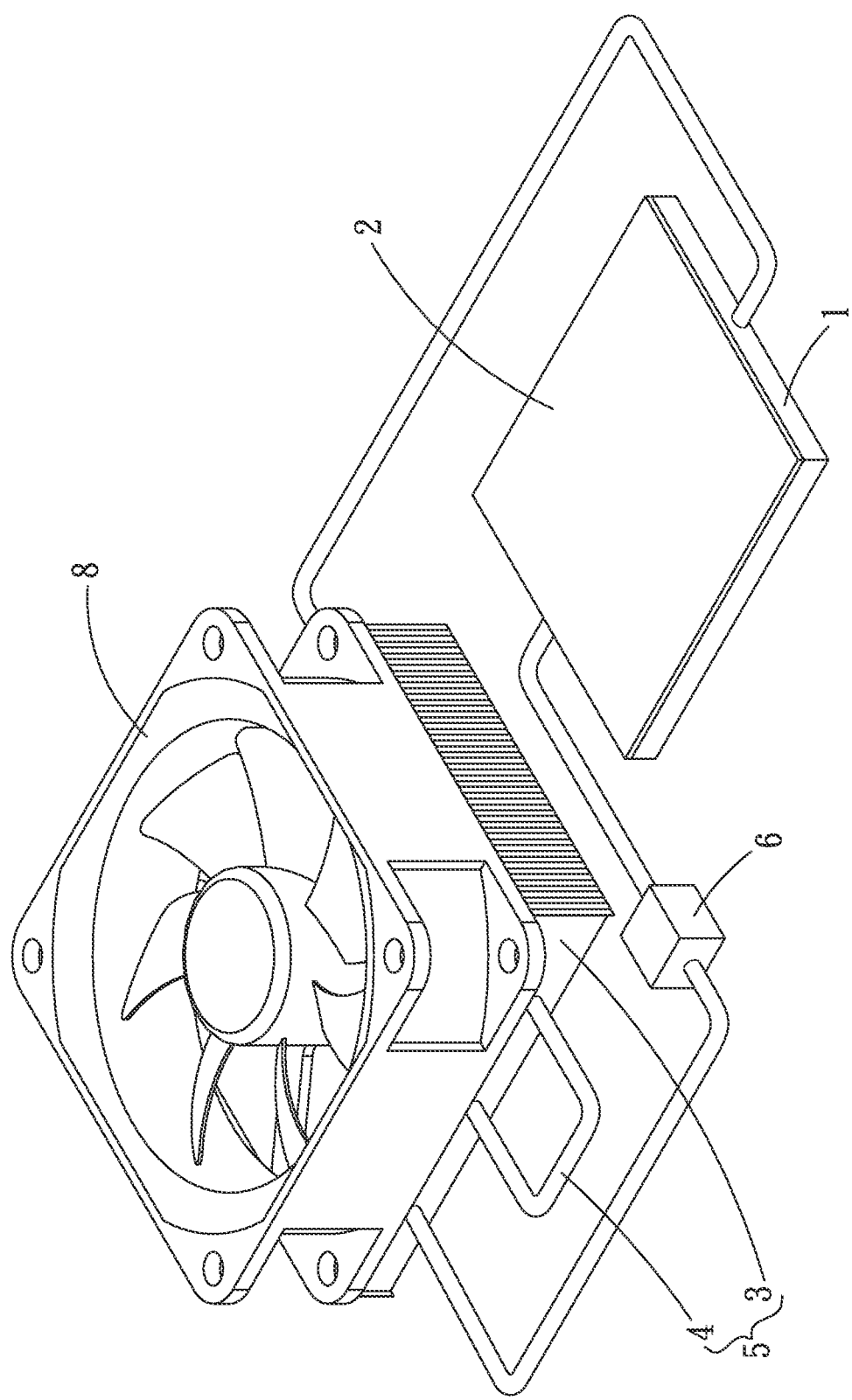
FIG. 9 is an assembled perspective view showing a variant of the loop type pressure-gradient-driven low-pressure thermosiphon device according to the first embodiment of the present invention.

The heat-dissipating element 4 is extended through by the pipeline 3, so that the pipeline 3 and the heat-dissipating element 4 together define a condensing section 5. A fan 8 can be additionally mounted to the condensing section 5 shown in FIG. 9.

The heat-dissipating element 4 can be any one of a radiating fin assembly and a heat sink. In the illustrated first embodiment, the heat-dissipating element 4 is a radiating fin assembly without being limited thereto.

Figure 7:
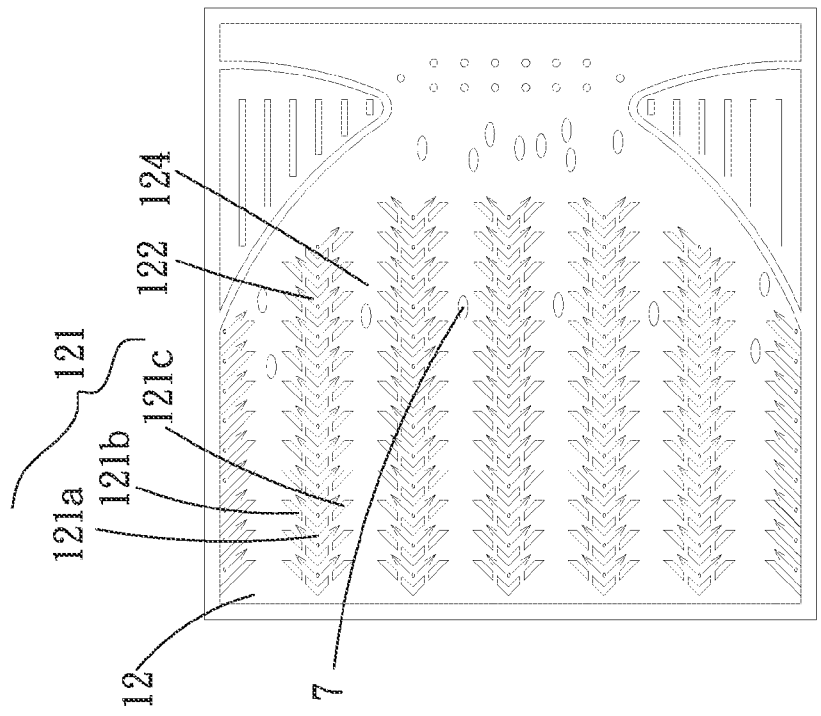
FIG. 7 is a front view showing a variant of the vaporizing section for the loop type pressure-gradient-driven low-pressure thermosiphon device according to the second embodiment of the present invention.
Figure 6:
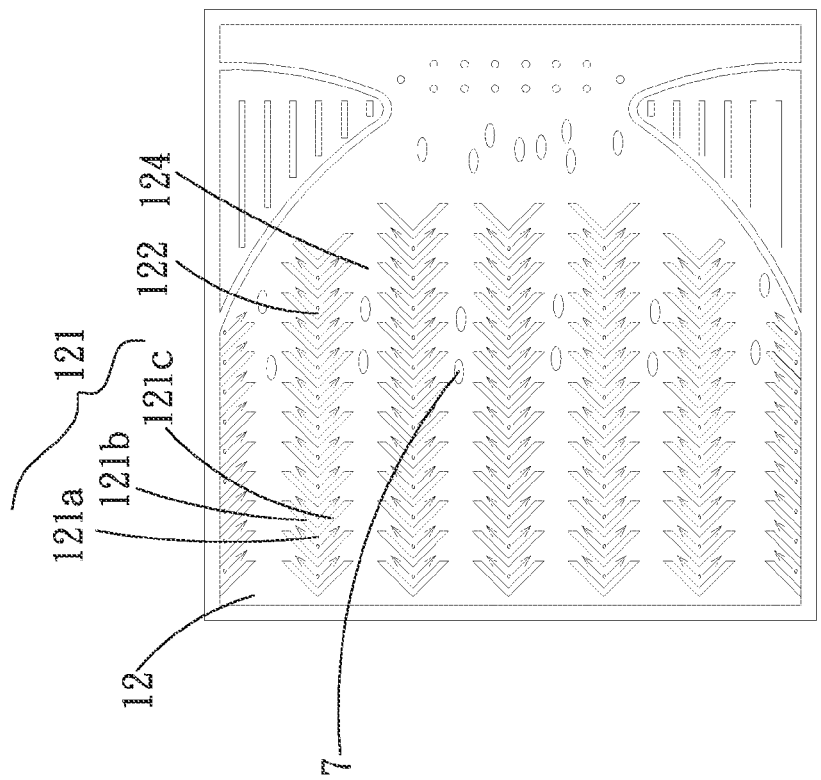
FIG. 6 is a front view showing a vaporizing section for a loop type pressure-gradient-driven low-pressure thermosiphon device according to a second embodiment of the present invention.

Please refer to FIGS. 6 and 7, which are front views showing two types of a vaporizing section for a loop type pressure-gradient-driven low-pressure thermosiphon device according to a second embodiment of the present invention. Since the second embodiment is similar to the first embodiment in some of the structure and the element connection thereof, these similar portions are not repeatedly described herein. The second embodiment is different from the first embodiment in that the flow-guiding members 121 of the vaporizing section 12 are respectively a substantially V-shaped rib. The V-shaped ribs each include a first vertex 121a, a first edge 121b, and a second edge 121c. The first edge 121b and the second edge 121c of each of the V-shaped ribs meet with each other at the first vertex 121a. The first flow passages 122 are respectively formed between two adjacent flow-guiding members 121. And, a first spacing 124 is left between two adjacent longitudinal rows of the flow-guiding members 121.

Each of the flow-guiding members 121 can also include a plurality of discontinuously arrayed first edges 121b and second edges 121c, as a variant of the vaporizing section 12 shown in FIG. 7.

Figure 8:
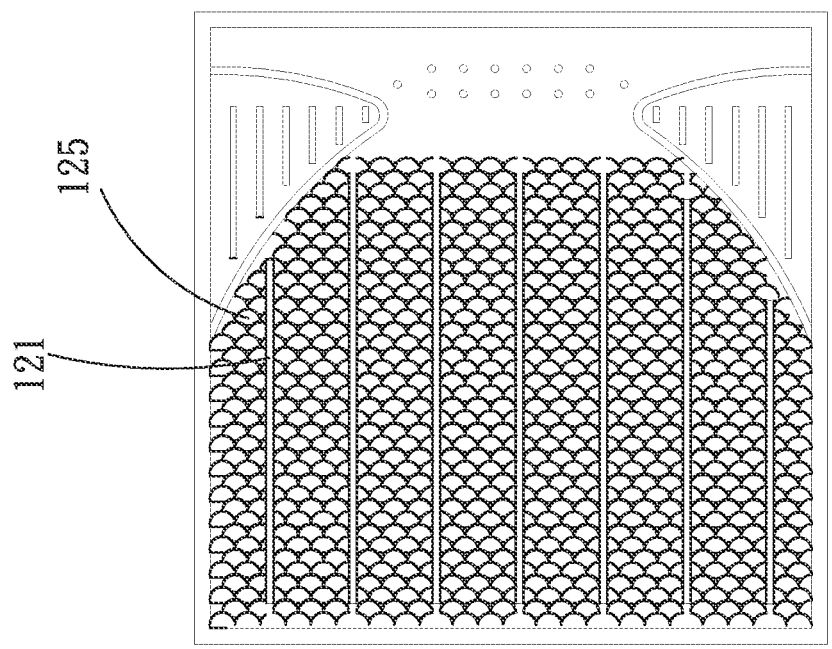
FIG. 8 is a front view showing a third variant of the vaporizing section for the loop type pressure-gradient-driven low-pressure thermosiphon device according to the first embodiment of the present invention.

Please refer to FIG. 8. In the first embodiment, a plurality of recesses 125 can be further provided on the case 1 between any two adjacent flow-guiding members 121. Each of the recesses 125 can be in the form of, for example, a circle, a rectangle, a triangle, a fish scale, or any other geometrical shape. In the illustrated first embodiment, the recesses 125 are in the form of and arrayed as fish scales without being limited thereto. The recesses 125 can be equally or unequally spaced from one another when being arrayed. Of course, the recesses 125 can also be provided between the flow-guiding members 121 in the second embodiment of the present invention.

Please refer to FIGS. 3 to 9 at the same time. As shown, the first and the second embodiment of the present invention provide a working fluid circulating and cooling technique for a loop type two-phase pressure-gradient-driven low-pressure thermosiphon device. This is a type of self-driven circulation. The working fluid used in the thermosiphon device can be a coolant selected from any one of purified water, methanol, acetone, and R134A. The chamber 11 of the loop type pressure-gradient-driven low-pressure thermosiphon device is in a vacuum state. Thus, the working fluid filled in the chamber 11 has a saturation temperature, i.e. a boiling point, at 2030° C. Vapor bubbles 7 formed in the chamber 11 gather at the free ends 122a of the first flow passages 122 in the vaporizing section 12 and then flow through the free zone 123, bringing the pressure of the vapor bubbles 7 to drop and thereby producing a pressure gradient in the chamber 11 needed to drive steam-water circulation in the thermosiphon device. In addition, in the condensing section 5, a local negative pressure suction formed due to the suddenly raised specific volume of steam condensate is helpful in the steam-water circulation. Of course, as in a variant of the first embodiment shown in FIG. 9, a pump 6 can be additionally provided between the case 1 and the pipeline 3, so as to avoid any possible dry heating of the working fluid in the chamber 11.

In the loop type pressure-gradient-driven low-pressure thermosiphon device according to the present invention, the first and the second flow passages 122, 131 are properly provided in the vaporizing section 12 and/or the condensing section 5 and the pipeline 3. According to the present invention, in the vaporizing section 12, the pressure of the working fluid is increased by way of approximate constant-volume heating, so as to produce high pressure that is needed to drive steam-water circulation; and/or the pressure at the low-pressure end of the steam-water circulation is reduced due to free expansion, condensing and pressure reduction at an outlet of the gas-state working fluid; and/or a heat receiving surface at the vaporizing section 12 is formed into a surface, such as a fish-scale like surface, a composite surface with fish-scale recesses and ribs or the like, that can advantageously provide upgraded boiling heat transfer performance to lower the boiling point, increase the heat transfer coefficient, and guide vapor flow direction; and/or a water-repellent condensing surface is provided to assist the working fluid to leave the condensing surface. With these arrangements, it is able to enhance the steam-water circulation in the loop type pressure-gradient-driven low-pressure thermosiphon device and reduce the thermal resistance thereof.

Generally, the loop type pressure-gradient-driven low-pressure thermosiphon device is so configured that the vaporizing section 12 and the condensing section 5 are connected to each other via the pipeline 3 to form a loop with the vaporizing section 12 located at a lower position and the condensing section 5 at an higher position. The working fluid is heated to have increased pressure in the vaporizing section 12, so as to push the produced vapor bubbles 7 through the pipeline 3 to the condensing section 5 located at the higher position. At the condensing section 5, the vapor bubbles 7 are condensed into liquid and flow back to the vaporizing section 12 under the gravity force. The more heat is received by the working fluid in the vaporizing section 12, the higher the pressure of the produced vapor will be. In this case, steam-water circulation at an increased speed will occur and the thermal resistance is lower. However, since electronic elements would have shortened service life when working in an environment with high temperature and high amount of heat, it is not a good idea to produce high pressure via high temperature or high amount of heat for the purpose of producing quick steam-water circulation. Therefore, according to the present invention, the pressure of the working fluid is increased by approximate constant-volume heat in the vaporizing section 12, so as to provide the high pressure needed to drive the steam-water circulation, and/or the pressure at the low-pressure end of the steam-water circulation is reduced by free expansion, condensing and pressure reduction at an outlet of the gas-state working fluid. Compared to the conventional loop type heat pipe device, the above-structured vaporizing section 12 for the present invention has the following advantages: (1) it has further reduced thermal resistance in a low-heat condition to thereby provide the electronic elements with better heat dissipating ability; (2) the thermal resistance is less influenced by the change in the positional angle of the condensing section relative the vaporizing section, i.e. the thermal resistance would increase only by about 20% when an elevation angle of the condensing section is reduced from 90° to 30°; in other words, one of the most significant advantages of the present invention is that the steam-water circulation can be activated when the elevation angle of the condensing section relative to the vaporizing section is relatively small; and (3) the working fluid can be driven to circulate without the need of providing any wick structure in the pipeline 3.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A loop type pressure-gradient-driven low-pressure thermosiphon device, comprising:
   a case internally defining a chamber, in which a vaporizing section and a guiding section are provided; the vaporizing section including a plurality of flow-guiding members being arrayed spaced from one another, so that at least one first flow passage is formed between any two adjacent flow-guiding members; the first flow passages respectively having at least one free end communicating with a free zone in the chamber; the free zone having a plurality of projections being arrayed spaced from one another; and the guiding section being positioned near the free zone only and having a first guiding portion, a second guiding portion forming a necked opening therebetween, and the first and second opposed guiding portions being arranged at the juncture between the vaporizing section and the free zone adjacent the free zone and contacting and extended from two opposite walls of the chamber each guiding portion intersecting one wall at two spaced places to form a generally V-shaped guiding portion extending toward a center of the chamber thereby forming said necked opening and indicating a pressure difference between the vaporizing section and the free zone; and channeling substantially all of the material from the vaporizing section through the necked opening being formed between the first and second guiding portions;

a cover being correspondingly closed onto the case to seal the chamber;

a pipeline having a second flow passage; the pipeline being connected at two ends to two opposite sides of the case, and the second flow passage being communicable with the free zone and the flow-guiding members and connected to the vaporizing section across ends of a desired flow path; wherein the end of the case formed at the vaporizing section and connected to the second flow passage is defined as an inlet end; wherein the second flow passage is further directly connected to the chamber in a horizontal direction; and at least one heat-dissipating element being extended through by the pipeline, so that the pipeline and the heat-dissipating element together define a condensing section.

2. The loop type pressure-gradient-driven low-pressure thermosiphon device as claimed in claim 1, wherein the heat-dissipating element is selected from the group consisting of a radiating fin assembly and a heat sink.

3. The loop type pressure-gradient-driven low-pressure thermosiphon device as claimed in claim 1, wherein the flow-guiding members are respectively an elongated rib; the elongated ribs being arrayed to transversely space from one another; and the first flow passages being respectively formed between any two adjacent elongated ribs.

4. The loop type pressure-gradient-driven low-pressure thermosiphon device as claimed in claim 3, wherein the flow-guiding members are also arrayed to longitudinally space from one another.

5. The loop type pressure-gradient-driven low-pressure thermosiphon device as claimed in claim 1, wherein the flow-guiding members are respectively a substantially V-shaped rib; the V-shaped ribs respectively including a first vertex, a first edge, and a second edge; the first and the second edge in each of the V-shaped ribs meeting with each other at the first vertex; the first flow passages being respectively formed between two adjacent V-shaped ribs; and a first spacing being left between two adjacent longitudinal rows of flow-guiding members.

6. The loop type pressure-gradient-driven low-pressure thermosiphon device as claimed in claim 5, wherein each of the flow-guiding members includes a plurality of discontinuously arrayed first edges and second edges.

7. The loop type pressure-gradient-driven low-pressure thermosiphon device as claimed in claim 1, further comprising a plurality of recesses provided on the case between any two adjacent flow-guiding members.

8. The loop type pressure-gradient-driven low-pressure thermosiphon device as claimed in claim 7, wherein the recesses respectively have a shape selected from the group consisting of a circle, a rectangle, a triangle, a fish scale, and any other geometrical shape.

9. The loop type pressure-gradient-driven low-pressure thermosiphon device as claimed in claim 1, further comprising a pump provided between the pipeline and the case.

10. The loop type pressure-gradient-driven low-pressure thermosiphon device as claimed in claim 1, wherein the condensing section is provided with a fan.

* * * * *